(12) United States Patent
Li et al.

(10) Patent No.: US 12,165,944 B2
(45) Date of Patent: Dec. 10, 2024

(54) ELECTRO-OPTICAL PACKAGE AND METHOD OF FABRICATION

(71) Applicant: ROCKLEY PHOTONICS LIMITED, Altrincham (GB)

(72) Inventors: Shuhe Li, Pasadena, CA (US); Gerald Cois Byrd, Shadow Hills, CA (US)

(73) Assignee: Rockley Photonics Limited, Altrincham (GB)

( * ) Notice: Subject to any disclaimer, the term of this patent is extended or adjusted under 35 U.S.C. 154(b) by 303 days.

(21) Appl. No.: 17/550,886

(22) Filed: Dec. 14, 2021

(65) Prior Publication Data

US 2022/0189841 A1 Jun. 16, 2022

(30) Foreign Application Priority Data

Dec. 16, 2020 (GB) ...................................... 2019881

(51) Int. Cl.
*H01L 23/34* (2006.01)
*H01L 23/00* (2006.01)

(52) U.S. Cl.
CPC .............. *H01L 23/34* (2013.01); *H01L 24/43* (2013.01); *H01L 24/44* (2013.01); *H01L 2924/14* (2013.01)

(58) Field of Classification Search
CPC ............................ H01L 23/38; G02B 6/4246
See application file for complete search history.

(56) References Cited

U.S. PATENT DOCUMENTS

| | | | | |
|---|---|---|---|---|
| 6,155,724 A | * | 12/2000 | Ichino | G02B 6/4244 |
| | | | | 385/94 |
| 2003/0015718 A1 | * | 1/2003 | Nakanishi | G02B 6/4253 |
| | | | | 257/680 |
| 2004/0080838 A1 | * | 4/2004 | Zbinden | H01L 23/38 |
| | | | | 359/820 |
| 2006/0006526 A1 | * | 1/2006 | Coronati | H01L 24/49 |
| | | | | 257/E23.102 |

FOREIGN PATENT DOCUMENTS

| | | |
|---|---|---|
| EP | 0 121 374 A1 | 10/1984 |
| GB | 2 422 483 A | 7/2006 |
| WO | WO 2012/004249 A1 | 1/2012 |

OTHER PUBLICATIONS

U.K. Intellectual Property Office Search Report, dated Jun. 7, 2021, for Patent Application No. GB2019881.8, 4 pages.

* cited by examiner

*Primary Examiner* — Evren Seven
(74) *Attorney, Agent, or Firm* — Lewis Roca Rothgerber Christie LLP

(57) ABSTRACT

An electro-optical package. In some embodiments, the package includes: a carrier; a first integrated circuit, on the carrier; a first bonding layer, between the carrier and the first integrated circuit; a thermoelectric cooler, on the carrier; a second integrated circuit, on the thermoelectric cooler; and a first wire bond. The first wire bond may connect a first pad, on the first integrated circuit, to a second pad, on the second integrated circuit, the first pad and the second pad having a height difference less than 100 microns.

18 Claims, 4 Drawing Sheets

ELECTRO-OPTICAL PACKAGE AND METHOD OF FABRICATION

CROSS-REFERENCE TO RELATED APPLICATION(S)

This application claims priority to United Kingdom Patent Application No. 2019881.8, filed in the United Kingdom Intellectual Property Office on Dec. 16, 2020, entitled "ELECTRO-OPTICAL PACKAGE AND METHOD OF FABRICATION", which is incorporated by reference herein in its entirety.

FIELD

One or more aspects of embodiments according to the present disclosure relate to electro-optical packages, and more particularly to a system and method for enabling the formation of short wire bonds in such packages.

BACKGROUND

In an electro-optical package designed for operation at high speed, different integrated circuits (e.g., a photonic integrated circuit and an electronic integrated circuit) may be connected together, or to other elements, by wire bonds, and it may be advantageous for the wire bonds to be short, so that the wire bond connections may have high bandwidth. In some circumstances, however, part-to-part variations in the thicknesses of the parts used to construct the electro-optical package may be significant relative to the target wire bond lengths. Such variations may be an obstacle to the forming of short wire bonds.

SUMMARY

According to an embodiment of the present invention, there is provided an assembly, including: a carrier; a first integrated circuit, on the carrier; a first bonding layer, between the carrier and the first integrated circuit; a thermoelectric cooler, on the carrier; a second integrated circuit, on the thermoelectric cooler; and a first wire bond, connecting a first pad, on the first integrated circuit, to a second pad, on the second integrated circuit, the first pad and the second pad having a height difference less than 100 microns.

In some embodiments, the first bonding layer has a thickness of at least 50 microns.

In some embodiments, the first bonding layer has a thickness of at least 100 microns.

In some embodiments, the first bonding layer includes epoxy as a major component.

In some embodiments, the assembly further includes: a printed circuit board, on the carrier; a second bonding layer, between the carrier and the printed circuit board; and a second wire bond, connecting a third pad, on the first integrated circuit, to a fourth pad, on the printed circuit board, the third pad and the fourth pad having a height difference less than 100 microns.

In some embodiments, the second bonding layer has a thickness of at least 50 microns.

In some embodiments, the second bonding layer has a thickness of at least 100 microns.

In some embodiments, the assembly further includes a spacer between the carrier and the first integrated circuit, wherein the first bonding layer is directly between the carrier and the spacer.

In some embodiments, the thermoelectric cooler extends through a cutout in the spacer.

In some embodiments, the assembly further includes a flex circuit between the spacer and the first integrated circuit.

In some embodiments, the spacer extends between the carrier and the printed circuit board.

In some embodiments, the second bonding layer is directly between the spacer and the printed circuit board.

In some embodiments, a portion of the spacer extends through an opening in the printed circuit board.

In some embodiments, a top surface of the portion of the spacer is flush, to within 20 microns, with a top surface of the printed circuit board.

According to an embodiment of the present invention, there is provided a method, including: bonding a thermoelectric cooler to a carrier; placing a first bonding agent and a spacer on the carrier, the first bonding agent being between the spacer and the carrier; adjusting the height of a top surface of the spacer to achieve, within 20 microns, a target height relative to a top surface of the thermoelectric cooler; and causing the first bonding agent to set.

In some embodiments, the method further includes: securing a first integrated circuit on the spacer; securing a second integrated circuit on the thermoelectric cooler; and forming a wire bond between a first pad, on the first integrated circuit, and a second pad, on the second integrated circuit.

In some embodiments, the first pad and the second pad have a height difference less than 100 microns.

In some embodiments, the method further includes placing a second bonding agent and a printed circuit board on the carrier, adjusting the height of a top surface of the printed circuit board to achieve, within 20 microns, a target height relative to a top surface of a portion of the spacer; and causing the second bonding agent to set.

In some embodiments, the spacer extends between the carrier and the printed circuit board, and the second bonding agent is directly between the spacer and the printed circuit board.

In some embodiments, the second bonding agent has the same composition as the first bonding agent.

BRIEF DESCRIPTION OF THE DRAWINGS

These and other features and advantages of the present disclosure will be appreciated and understood with reference to the specification, claims, and appended drawings wherein:

FIG. 1 is drawn to scale for one embodiment, and each of FIGS. 2A and 2B is drawn to scale for one embodiment.

DETAILED DESCRIPTION

The detailed description set forth below in connection with the appended drawings is intended as a description of exemplary embodiments of an electro-optical package and a method for fabricating an electro-optical package provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

In an electro-optical package, various components or interconnects may be connected to each other by wire bonds, which, in some embodiments, may be short so as to provide high-bandwidth connections. Each of the parts connected together by wire bonds may, however, be mounted in the package in a manner that results in significant variation in the height of the upper surface (the surface on which wire bond pads (or simply "pads") are formed) of the part. This may result from the accumulation (or "stackup") of contributions, from part-to-part thickness variations, of parts assembled in a stack. For example, if a first integrated circuit is installed adjacent to a second integrated circuit, and the second integrated circuit (but not the first) is mounted on a thermoelectric cooler (the thermoelectric cooler being a part that exhibits large part-to-part thickness variations), the height difference between wire bond pads on the first integrated circuit and wire bond pads on the second integrated circuit may vary significantly (in part because of the part-to-part thickness variations of the thermoelectric cooler) and the height difference may, in some assemblies, be too great for a short wire bond to be formed.

Figure 1:
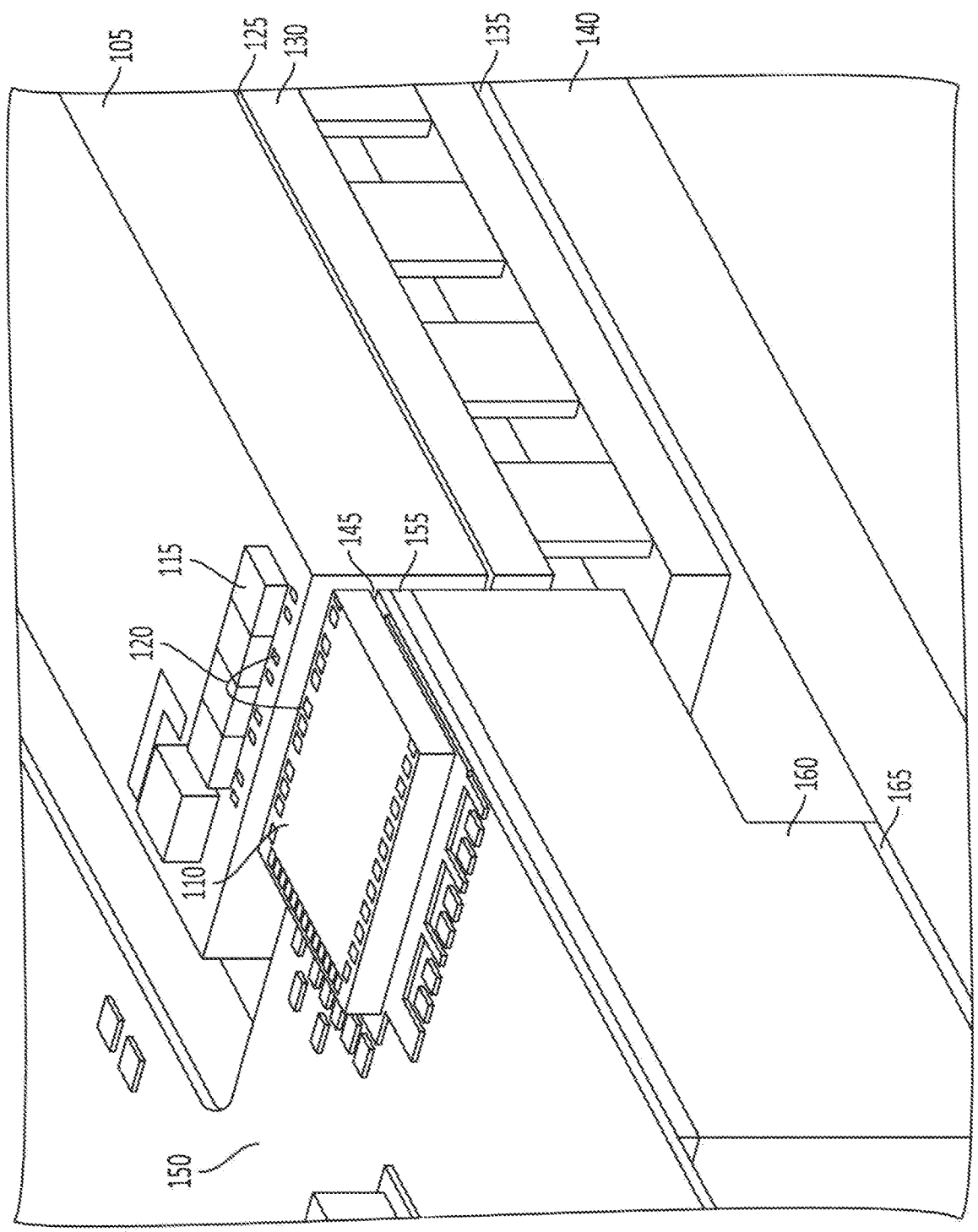
FIG. 1 is a cutaway perspective view of a portion of an electro-optical assembly, according to an embodiment of the present disclosure.

FIG. 1 is a cutaway perspective view of a system for controlling such height differences. In some embodiments, as mentioned above, an electro-optical assembly includes a photonic integrated circuit 105 and an electronic integrated circuit 110. The photonic integrated circuit 105 may include an array of V-grooves 230 (FIG. 2A) for aligning a plurality of optical fibers to an array of waveguides on the photonic integrated circuit 105, and an array of electro-optical chips 115 (e.g., photodetectors or optical modulators) for converting between electrical signals and optical signals. Mode converters (e.g., tapered waveguides), on the photonic integrated circuit 105 may perform optical mode conversion between the mode size of an optical fiber, a mode size of waveguides employed to transport light on the photonic integrated circuit 105, and a mode size that couples efficiently to the electro-optical chips 115.

In the case of an electro-optical assembly configured as a transmitter, the electronic integrated circuit 110 may generate electrical drive signals for the array of electro-optical chips 115, each of which may be an optical modulator. These electrical drive signals may be transmitted from the electronic integrated circuit 110 to the electro-optical chips 115 through an array of wire bonds 120 (of which only one is shown, for clarity). The length of each wire bond 120 may be less than 250 microns, to achieve acceptable bandwidth for the electrical connections between the electronic integrated circuit 110 and the photonic integrated circuit 105.

In some embodiments, the photonic integrated circuit 105 and the electronic integrated circuit 110 may be positioned in the electro-optical assembly such that the separation between the two wire bond pads of each pair of wire bond pads to be connected by a wire bond is small, e.g., sufficiently small to enable the formation of short wire bonds (e.g., wire bonds that are 250 microns or shorter). For example, the height difference between a first pad on the electronic integrated circuit 110 and a second pad on the photonic integrated circuit 105 may be less than a specified maximum (the specified maximum being between 5.0 microns and 150.0 microns) e.g., less than 100 microns, or less than 50 microns or less than 30 microns.

The photonic integrated circuit 105 may be secured (e.g., bonded, by a layer of bonding agent, or "bonding layer" 125) to a thermoelectric cooler 130, which may be secured (e.g., bonded, by a layer of bonding agent 135) to a carrier (or "carrier base") 140. The electronic integrated circuit 110 may be secured (e.g., bonded, by a layer of bonding agent 145) to a flex circuit 150, which may be secured (e.g., bonded, by a layer of bonding agent 155) to a spacer (or "carrier frame") 160. The spacer 160 may be bonded to the carrier 140 by a layer of a bonding agent 165, the thickness of which may be adjusted during assembly.

The adjustable-thickness layer of bonding agent 165 may be used to compensate for part-to-part thickness variations of some of the components of the assembly. For example, if the thermoelectric cooler 130 in a partially-assembled electro-optical assembly is thicker (i.e., taller, in the orientation of FIG. 1) than average, causing the wire bond pads on the photonic integrated circuit 105 to be correspondingly higher above the upper surface of the carrier 140, then the thickness of the adjustable-thickness layer of bonding agent 165 may be increased, to cause the wire bond pads on the electronic integrated circuit 110 to also be correspondingly higher above the upper surface of the carrier 140.

To set the thickness of the adjustable-thickness layer of bonding agent 165 during the assembly process, the thermoelectric cooler 130 may be bonded to the carrier 140, and a relatively thick layer of bonding agent may be dispensed (e.g., on the carrier 140 or on the spacer 160) between the spacer 160 and the carrier 140. A suitable fixture may then be used to set (e.g., by compressing the layer of bonding agent between the spacer 160 and the carrier 140) the height of the top surface of the spacer 160 relative to the height of the top surface of the thermoelectric cooler 130. This setting of the height of the top surface of the spacer 160 may have the effect that when the flex circuit 150 and the electronic integrated circuit 110 are installed on the spacer 160, and the photonic integrated circuit 105 is installed on the thermoelectric cooler 130, the wire bond pads on the electronic integrated circuit 110 are at substantially the same height above the carrier 140 as the wire bond pads on the photonic integrated circuit 105 (e.g., the height difference being less than a specified maximum height difference, the specified maximum height difference being between 5 microns and 50 microns). The bonding agent may then be caused to set, fixing the thickness (or "bond-line thickness") of the adjustable-thickness layer of bonding agent 165.

Figure 2A:
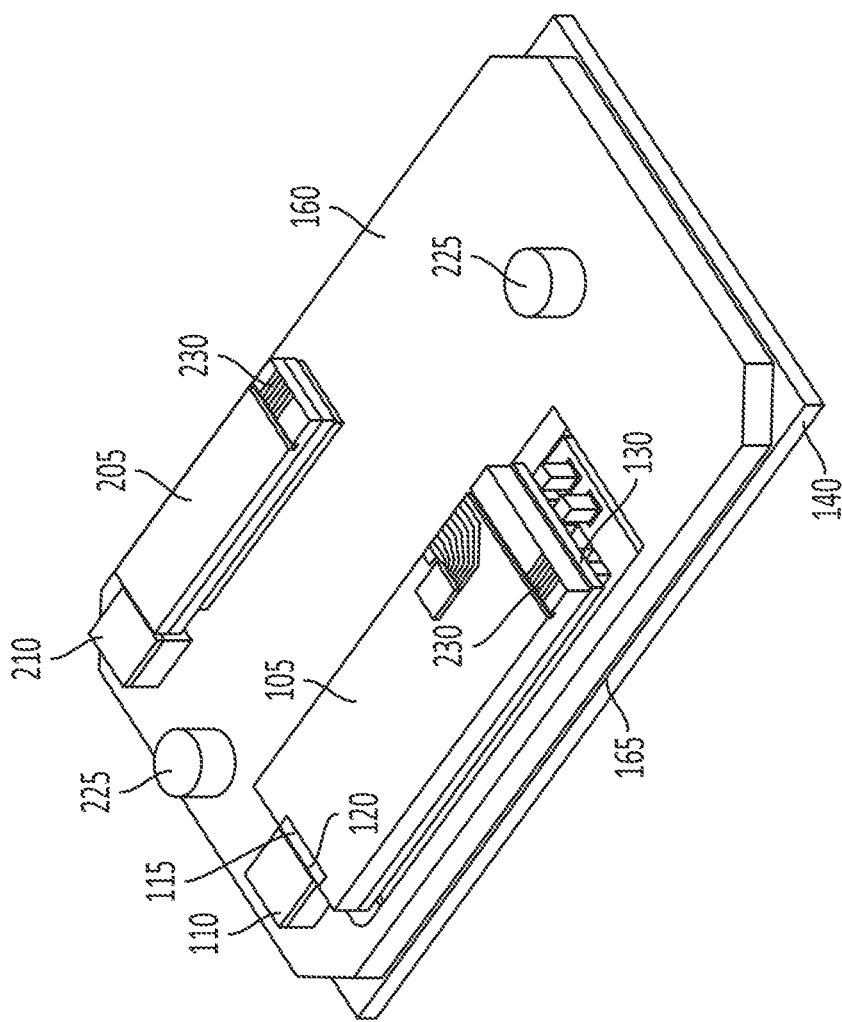
FIG. 2A is a perspective view of a partially assembled electro-optical assembly, according to an embodiment of the present disclosure.

In some embodiments, the spacer may have an opening (e.g., a cutout) through which the thermoelectric cooler 130 extends, so that the spacer 160 has the shape of a frame extending around the thermoelectric cooler 130. For example, the embodiment illustrated in FIG. 2A includes a first electronic integrated circuit 110 and a first photonic integrated circuit 105. These two elements are configured to operate as a transmitter (configured to transmit data in optical form, e.g., as modulated light), and the first photonic integrated circuit 105 is installed on a thermoelectric cooler 130 to provide temperature control of the first photonic integrated circuit 105. The combination of a second photonic integrated circuit 205 and a second electronic integrated circuit 210 is configured to operate as a receiver. In the embodiment of FIG. 2A, the temperature stability required for the second photonic integrated circuit 205 is not sufficiently great to require a second thermoelectric cooler, for the second photonic integrated circuit 205.

As in the embodiment of FIG. 1, in the embodiment of FIG. 2A the thickness of the layer of bonding agent 165 between the carrier 140 and the spacer 160 may be adjusted so that, when both the photonic integrated circuit 105 and the electronic integrated circuit 110 have been installed, their top surfaces are substantially flush (with the height difference of any pair of wire bond pads being less than a specified maximum height difference, the specified maximum height difference being between 5 microns and 50 microns), making possible the forming of short wire bonds Each of the electronic integrated circuits 110, 210, may have, in addition to the electrical interface to the photonic integrated circuit 105, a second electrical interface at which, for example, the first electronic integrated circuit 110 may receive data to be used to generate electrical drive signals for the electro-optical chips 115.

Figure 2B:
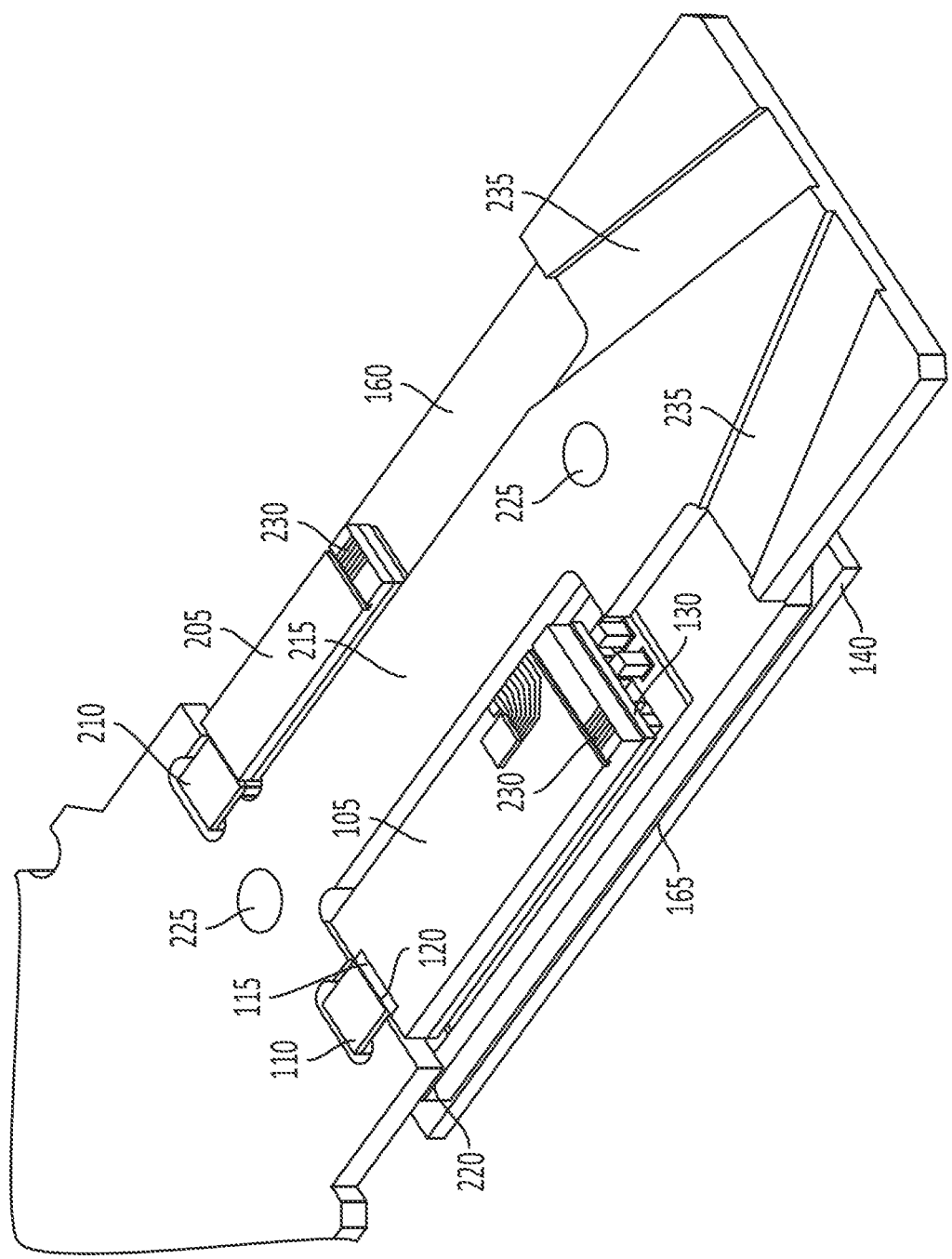
FIG. 2B is a perspective view of a portion of an electro-optical assembly, according to an embodiment of the present disclosure.

Referring to FIG. 2B, connections to the second interface of the first electronic integrated circuit 110 may be made using wire bonds from wire bond pads on a printed circuit board 215 to corresponding wire bond pads on the first electronic integrated circuit 110 (and connections to the second interface of the second electronic integrated circuit 210 may be similarly made using wire bonds to the printed circuit board 215). An adjustable-thickness layer of bonding agent 220 may be used to bond the printed circuit board 215 to the spacer 160 (or directly to (e.g., to a suitable mesa on) the carrier, if the spacer does not extend between the carrier 140 and the printed circuit board 215). The thickness of this layer 220 may be adjusted to compensate, for example, for part-to-part variations in the thickness of the printed circuit board 215.

Figure 2C:
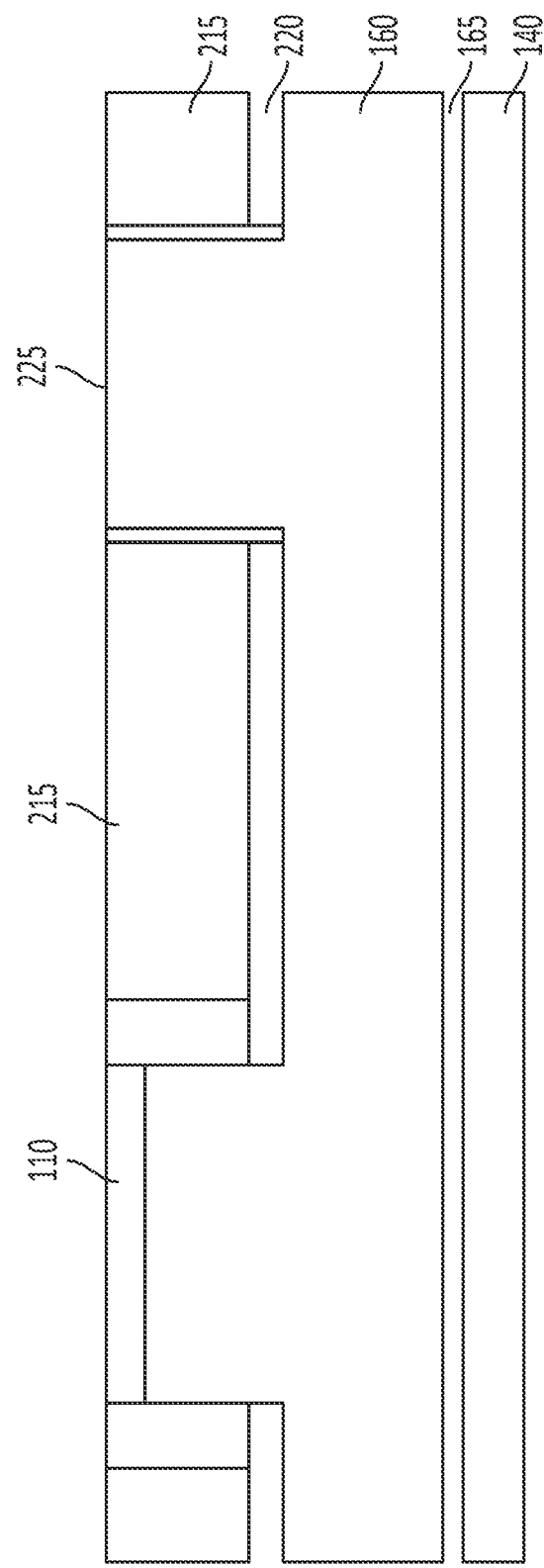
FIG. 2C is a cross-sectional view of a portion of an electro-optical assembly, according to an embodiment of the present disclosure.

To facilitate the adjusting of the thickness of the adjustable-thickness layer of bonding agent 220 under the printed circuit board 215, the spacer may include one or more posts 225 each having a top surface that is at the same height (or that is within, e.g., 30 microns, or 10 microns, of being at the same height) as the top surface of the first electronic integrated circuit 110, when the first electronic integrated circuit 110 is installed on the spacer. These posts 225 may extend through openings (e.g., holes) in the printed circuit board 215 when the latter is installed, as shown in FIG. 2B. As such, during assembly, a relatively thick layer of bonding agent may be dispensed (e.g., on the spacer 160) between the spacer 160 and the printed circuit board 215, and the printed circuit board may be pressed down onto the spacer 160 (or onto the carrier 140) with a suitable tool (e.g., a tool having a flat bottom surface (except for suitable recesses for avoiding contact between (i) the electronic integrated circuits 110, 210 and the photonic integrated circuits 105, 205 and (ii) the tool)) until the tool contacts (and is stopped by) the posts 225. The bonding agent between the spacer 160 and the printed circuit board 215 may then be caused to set, fixing the height of the top surface of the printed circuit board 215 relative to the height of the top surfaces of the electronic integrated circuits 110, 210. FIG. 2C is a cross-sectional view of the embodiment of FIGS. 2A and 2B, illustrating how the top surfaces of one of the posts 225 and of first electronic integrated circuit 110 are flush with the top surface of the printed circuit board 215. FIG. 2B shows channels 235 in the printed circuit board 215 for guiding fiber-optic cables.

The bonding agent used to form any of the adjustable-thickness layers of bonding agent 165, 220 may be composed of any suitable material that is deformable when the relative heights of the parts of the assembly are being adjusted, that may be caused to set, when the adjustment is complete, and that, when set, maintains the thickness of the set layer of bonding agent 165, 220. For example, the adjustable-thickness layers of bonding agent 165, 220 may be composed (i) of a suitable (heat-curing, two-part, or UV-curing) epoxy, or (ii) of solder. As used herein "causing the bonding agent to set" means causing the bonding agent to be in a state in which the thickness of the adjustable-thickness layer of bonding agent 165, 220 is maintained. For example, if the bonding agent is solder, causing the bonding agent to set may mean allowing the solder to cool so that it solidifies, and if the bonding agent is epoxy, causing the bonding agent to set may mean curing the epoxy (e.g., using heat, using a chemical reaction between components of the uncured epoxy (in the case of a two-part epoxy), or using ultraviolet radiation).

In a completed assembly corresponding to FIG. 1 and in a completed assembly corresponding to FIGS. 2A-2C, the bond line thickness of each of the adjustable-thickness layers of bonding agent 165, 220 may be, e.g., between 150 and 250 microns, and the thickness of each of the other layers of bonding agent may be within 10 microns of 50 microns. The remaining height difference between the wire bond pads of any pair of wire bond pads (after compensation, using one or more adjustable-thickness layers of bonding agent 165, 220) may have a standard deviation of as little as 50 microns, or 40 microns, or even 30 microns.

In some embodiments, the height of the electronic integrated circuit 110 relative to the carrier 140 may be set by an adjustable-thickness layer of bonding agent between the spacer 160 and the electronic integrated circuit 110 (e.g., between the spacer 160 and the flex circuit 150, if a flex circuit 150 is present, or directly between the electronic integrated circuit 110 and the spacer 160, if no flex circuit 150 is present) instead of (or in addition to) the adjustable-thickness layer of bonding agent 165 between the carrier 140 and the spacer 160. In some embodiments, instead of the electronic integrated circuit 110 being secured to a spacer 160 that is a separate part from the carrier 140, a separate spacer 160 is not used, and the electronic integrated circuit 110 is secured to a raised portion (e.g., a projection, plinth, or mesa) of the carrier having a horizontal shelf, at a height such that when the electronic integrated circuit 110 is bonded to the shelf with an adjustable-thickness layer of bonding agent it may be set at a height at which its top surface is flush with the top surface of the photonic integrated circuit 105, and the wire bond pads on the electronic integrated circuit 110 are at the same height, or nearly at the same height, as the wire bond pads on the photonic integrated circuit 105.

As used herein, any structure or layer that is described as being "made of" or "composed of" a substance should be understood (i) in some embodiments, to contain that substance as the primary component or (ii) in some embodiments, to contain that substance as the major component. As used herein, the term "major component" refers to a component that is present in a composition, polymer, or product in an amount greater than an amount of any other single component in the composition or product. In contrast, the term "primary component" refers to a component that makes up at least 50% by weight or more of the composition, polymer, or product.

As used herein, "a portion of" something means "at least some of" the thing, and as such may mean less than all of, or all of, the thing. As such, "a portion of" a thing includes the entire thing as a special case, i.e., the entire thing is an example of a portion of the thing. As used herein, when a second number is "within Y %" of a first number, it means that the second number is at least (1−Y/100) times the first number and the second number is at most (1+Y/100) times the first number. As used herein, the word "or" is inclusive, so that, for example, "A or B" means any one of (i) A, (ii) B, and (iii) A and B. As used herein, when a method (e.g., an adjustment) or a first quantity (e.g., a first variable) is referred to as being "based on" a second quantity (e.g., a second variable) it means that the second quantity is an input to the method or influences the first quantity, e.g., the second quantity may be an input (e.g., the only input, or one of several inputs) to a function that calculates the first quantity, or the first quantity may be equal to the second quantity, or the first quantity may be the same as (e.g., stored at the same location or locations in memory as) the second quantity.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present. If a layer is referred to as being "directly between" two layers, it is the only layer between the two layers, and no intervening layers are present It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of an electro-optical package and a method for fabricating an electro-optical package have been specifically described and illustrated herein, many modifications and variations will be apparent to those skilled in the art. Accordingly, it is to be understood that an electro-optical package and a method for fabricating an electro-optical package constructed according to principles of this disclosure may be embodied other than as specifically described herein. The invention is also defined in the following claims, and equivalents thereof.

What is claimed is:

1. An assembly, comprising:
    a carrier;
    a first integrated circuit, on the carrier;
    a first bonding layer, between the carrier and the first integrated circuit;
    a thermoelectric cooler, on the carrier;
    a second integrated circuit, on the thermoelectric cooler;
    a first wire bond, connecting a first pad, on the first integrated circuit, to a second pad, on the second integrated circuit;
    a printed circuit board, on the carrier;
    a second bonding layer, between the carrier and the printed circuit board; and
    a second wire bond, connecting a third pad, on the first integrated circuit, to a fourth pad, on the printed circuit board,
    the first pad and the second pad having a height difference less than 100 microns, and
    the third pad and the fourth pad having a height difference less than 100 microns.
2. The assembly of claim 1, wherein the first bonding layer has a thickness of at least 50 microns.
3. The assembly of claim 1, wherein the first bonding layer has a thickness
    of at least 100 microns.
4. The assembly of claim 1, wherein the first bonding layer comprises epoxy as a major component.
5. The assembly of claim 1, wherein the second bonding layer has a thickness of at least 50 microns.
6. The assembly of claim 5, wherein the second bonding layer has a thickness of at least 100 microns.
7. The assembly of claim 1, further comprising a spacer between the carrier and the first integrated circuit,
    wherein the first bonding layer is directly between the carrier and the spacer.
8. The assembly of claim 7, wherein the thermoelectric cooler extends through a cutout in the spacer.
9. The assembly of claim 7, further comprising a flex circuit between the spacer and the first integrated circuit.
10. The assembly of claim 7, wherein the spacer extends between the carrier and the printed circuit board.
11. The assembly of claim 7, wherein the second bonding layer is directly between the spacer and the printed circuit board.
12. The assembly of claim 7, wherein a portion of the spacer extends through an opening in the printed circuit board.
13. The assembly of claim 12, wherein a top surface of the portion of the spacer is flush, to within 20 microns, with a top surface of the printed circuit board.
14. A method of fabricating the assembly of claim 1, the method comprising:
    bonding the thermoelectric cooler to the carrier;
    placing a first bonding agent and a spacer on the carrier, the first bonding agent being between the spacer and the carrier;
    adjusting the height of a top surface of the spacer to achieve, within 20 microns, a target height relative to a top surface of the thermoelectric cooler; and
    causing the first bonding agent to set.
15. The method of claim 14, further comprising:
    securing the first integrated circuit on the spacer;
    securing the second integrated circuit on the thermoelectric cooler; and forming the first wire bond between the first pad, on the first integrated circuit, and the second pad, on the second integrated circuit.

16. The method of claim 14, further comprising placing a second bonding agent and a printed circuit board on the carrier,
adjusting the height of a top surface of the printed circuit board to achieve, within 20 microns, a target height relative to a top surface of a portion of the spacer; and
causing the second bonding agent to set.

17. The method of claim 16, wherein the spacer extends between the carrier and the printed circuit board, and the second bonding agent is directly between the spacer and the printed circuit board.

18. The method of claim 16, wherein the second bonding agent has the same composition as the first bonding agent.

* * * * *